United States Patent
Teer et al.

(10) Patent No.: US 6,726,993 B2
(45) Date of Patent: Apr. 27, 2004

(54) CARBON COATINGS, METHOD AND APPARATUS FOR APPLYING THEM, AND ARTICLES BEARING SUCH COATINGS

(75) Inventors: Dennis Gerald Teer, Worcestershire (GB); Didier Camino, Anoye (FR); Andrew H S Jones, Shropshire (GB)

(73) Assignee: Teer Coatings Limited (GB)

(*) Notice: Subject to any disclaimer, the term of this patent is extended or adjusted under 35 U.S.C. 154(b) by 0 days.

(21) Appl. No.: 09/201,980

(22) Filed: Dec. 1, 1998

(65) Prior Publication Data

US 2003/0129407 A1 Jul. 10, 2003

(30) Foreign Application Priority Data

Dec. 2, 1997 (GB) ............................................. 9725413
Mar. 19, 1998 (GB) ............................................. 9805743

(51) Int. Cl.[7] ................................................. B32B 9/00
(52) U.S. Cl. ...................... 428/408; 428/216; 428/336; 428/446; 428/457; 428/469
(58) Field of Search ................................. 428/408, 216, 428/336, 457, 469; 423/446

(56) References Cited

U.S. PATENT DOCUMENTS

| | | | |
|---|---|---|---|
| 4,524,106 A | | 6/1985 | Flasck |
| 4,597,844 A | | 7/1986 | Hiraki et al. |
| 4,647,494 A | * | 3/1987 | Meyerson et al. ........... 428/216 |
| 4,725,345 A | | 2/1988 | Sakamoto et al. |
| 4,772,513 A | * | 9/1988 | Sakamoto et al. ........... 428/408 |

(List continued on next page.)

FOREIGN PATENT DOCUMENTS

| | | |
|---|---|---|
| EP | 0 244 874 A2 | 11/1987 |
| EP | 0 561 641 A1 | 9/1993 |

(List continued on next page.)

OTHER PUBLICATIONS

WPI Accession No. 92–147406/18 & JP 4089212A (Canon) see Abstract.

(List continued on next page.)

Primary Examiner—Archene Turner

(57) ABSTRACT

Articles are disclosed which bear a carbon coating layer, wherein carbon-carbon bonding within the coating layer is mostly of the sp2 form: wherein the coating has a specific wear rate under wet conditions of less than $10^{-6}$ m$^3$/Nm: wherein the coating has an adhesion critical load of at least 70N: wherein the coating has a hardness of at least 1000 VHN: wherein the coating has a coefficient of friction (dry) of not more than 01. The coating may be a multi-layer coating containing successive metal-containing and carbon layers. The article may be constituted as a medical prosthesis. Methods are disclosed of forming hard wear resistant carbon coatings by sputter ion plating with at least one carbon target in which an ion current density of for example above 0.5 mA/cm$^2$ is applied at the substrate to be coated in order to deposit a carbon-containing coating layer and/or which comprise sputter ion plating with at least one carbon target and at least one metal target in order to deposit a carbon coating layer and a metal-containing coating layer. Coating apparatus suitably comprises magnetron sputter ion plating apparatus having at least one metal-donating target and at least one carbon-donating target. Such apparatus may include at least two magnetrons arranged to generate a magnetic field between them with field lines extending from one magnetron to the or an other, and the magnetrons, and field lines extending directly from one magnetron to the or an other, form a barrier which tends to prevent the escape of electrons from within a plasma-containing working space within which the substrate is coated.

19 Claims, 1 Drawing Sheet

U.S. PATENT DOCUMENTS

| | | | |
|---|---|---|---|
| 4,795,656 A | | 1/1989 | Mizoguchi et al. |
| 4,932,331 A | * | 6/1990 | Kurihara et al. ............. 423/446 |
| 5,202,156 A | | 4/1993 | Yamamoto et al. |
| 5,237,967 A | * | 8/1993 | Willermet et al. ........... 428/408 |
| 5,266,409 A | * | 11/1993 | Schmidt et al. ............. 428/336 |
| 5,370,684 A | | 12/1994 | Vallana et al. |
| 5,470,661 A | * | 11/1995 | Bailey et al. ................ 428/408 |
| 5,474,816 A | * | 12/1995 | Falabella .................... 423/445 |
| 5,830,331 A | * | 11/1998 | Kim et al. |

FOREIGN PATENT DOCUMENTS

| | | |
|---|---|---|
| EP | 0 579 983 A1 | 1/1994 |
| EP | 0 724 022 A1 | 7/1996 |
| EP | 0 724 023 A1 | 7/1996 |
| GB | 2 303 380 A | 2/1997 |
| GB | 2 325 473 A | 11/1998 |
| JP | 63-065074 * | 3/1988 |

OTHER PUBLICATIONS

WPI Accession No. 90–129882/17 & JP 2080558A (Nippon) see Abstract.

WPI Accession No. 89–162159/22 & JP 1105326 A(Matsushita) see Abstract.

* cited by examiner

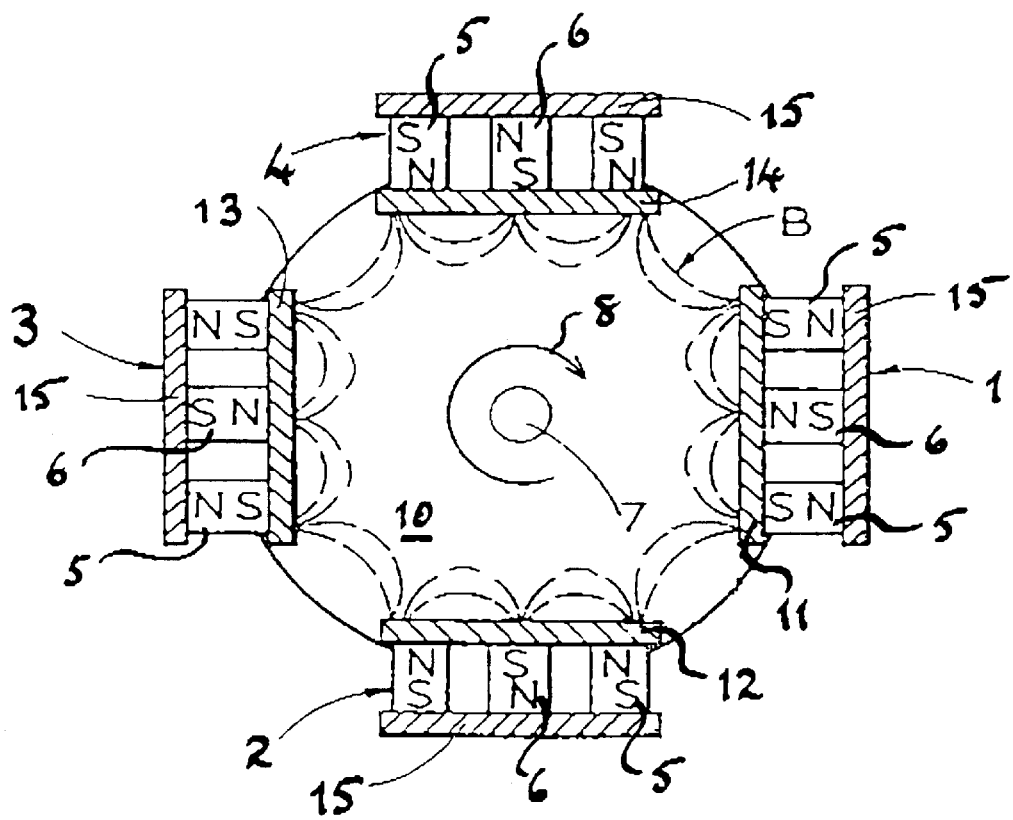

CARBON COATINGS, METHOD AND APPARATUS FOR APPLYING THEM, AND ARTICLES BEARING SUCH COATINGS

This invention relates to carbon-containing coatings and to methods of and apparatus for the deposition of such coatings, and to articles bearing such coatings.

Carbon coatings are known per se. This invention is particularly concerned with carbon coatings having good hardness and wear resistance. Carbon coatings which have been produced in the past in order to give highly wear resistant surfaces have typically been diamond-like carbon coatings, i.e. carbon coatings which contain a significant amount of material with diamond, sp3, bonding.

This invention is based on research carried out with the aim of improving the tribological properties of carbon-containing coatings, and it is an object of this invention to provide a new carbon-containing coating with improved tribological properties and a method and apparatus which may be used to form such a carbon coating.

Accordingly, and in it first aspect, the present invention provides an article bearing a carbon-containing coating, wherein carbon-carbon bonding within the coating is mostly of the graphitic sp2 form.

It is indeed surprising that a carbon-containing coating which is graphitic in structure can in fact have tribological properties, such as greater hardness and wear-resistance, which are much improved over the properties of a carbon-containing coating which is of diamond-like structure.

Such a coating is preferably formed by sputtering, and in its second aspect, the invention provides a method of applying a coating to an article characterised in that such method comprises using a sputter ion plating system with at least one carbon target in which an ion current density of above 0.5 mA/cm$^2$ is applied at the substrate to be coated in order to deposit a carbon coating layer.

This method provides a coating of much improved quality, in particular as regards its tribological properties. The coating layer contains sufficient carbon for there to be carbon-carbon (as opposed to carbide) bonds within it. When deposited in this way, it will be found that those carbon-carbon bonds are predominantly of the sp2 or graphitic type.

The invention also provides, in its third aspect, a method of applying a coating to an article characterised in that such method comprises using a sputter ion plating system with at least one carbon target in which an ion current density applied at the substrate to be coated is sufficiently high thereby to deposit a carbon coating layer having improved tribological properties and in which carbon-carbon bonds are predominantly of the graphitic sp2 form.

According to a fourth aspect of the invention, there is provided an article bearing a carbon-containing coating, wherein said coating comprises a succession of carbon and metal-containing layers and in which carbon-carbon bonding within the or each carbon layer is mostly of the graphitic sp2 form, and the invention extends to a method of applying a carbon coating to an article comprising using a sputter ion plating system with at least one carbon target and at least one metal target in order to deposit a carbon coating layer and a metal-containing coating layer.

The use of targets of different compositions, particularly when the substrate is suitably rotated, allows a considerable degree of control of the final coating composition and of different strata within it.

We have found that the presence of a said metal-containing layer can make a significant contribution to the coating properties. In some preferred embodiments of the invention, such a metal-containing layer is an underlayer deposited directly onto the substrate to be overcoated with carbon. Such a metal-containing underlayer is very effective in promoting adhesion between a carbon layer and a substrate.

Thus a method according to the invention preferably comprises using a metal target to form a metal-containing underlayer directly onto the substrate which is over-coated with the or a said carbon coating layer.

Such a metal-containing underlayer is preferably deposited to a thickness of between 50 and 200 nm.

The underlayer can comprise an initial stratum of metal followed by a second stratum consisting of the metal and carbon produced by co-deposition from metal and carbon targets. This stratum may be harder than the metal stratum and can improve the tribological behaviour of the subsequent carbon coating.

Alternatively, or in addition, there may be provided a one or more metal-containing layers each of which is an intermediate layer located between successive carbon layers. This promotes cohesiveness of the coating as a whole. We have found that when a uniform (graphitic) carbon coating is deposited on a substrate, once a certain thickness threshold is exceeded, the coating may have a tendency to spall and that this tendency increases with increasing thickness. We have also found, however, that this tendency is alleviated or even eliminated if thin carbon layers are interleaved with metal-containing layers. In order to avoid any risk of such spalling, a said carbon-containing layer is preferably formed to a thickness of up to 1 $\mu$m.

Significant advantages are given by embodiments of the invention in which said coating is built up from a succession of alternating metal-containing and carbon coating layers respectively formed predominantly (that is, more than 50 atoms %) from metal and from carbon. By making use of this feature, the coating as a whole may be built up to any desired thickness, for example up to 10 $\mu$m, preferably in the range 1 to 5 $\mu$m, and without risk of spalling of the carbon, provided that the carbon layers have thicknesses below 1 $\mu$m.

The use of a transition metal, that is a metal in one of Groups 3 to 10 (new IUPAC notation) of the Periodic Table as shown on page 1–15 of *Handbook of Chemistry and Physics*, 77th Edition 1996–1997 (CRC Press), preferably chromium or titanium, is found particularly effective.

A said coating is suitably formed by magnetron sputter ion plating, and most preferably by a technique known as closed field unbalanced magnetron sputter ion plating (CFUBMSIP). Such a technique can be used to produce coatings in accordance with this invention which have quite outstanding properties. Apparatus for use in such a technique is described later in this specification with reference to the accompanying diagrammatic drawing. Such apparatus is further described in UK Patent No. 2 258 343, and the full contents of that specification are incorporated herein by this reference.

Advantageously, at least two magnetrons are arranged to generate a magnetic field between them with field lines extending from one said magnetron to the or an other said magnetron, and said magnetrons, and field lines extending directly from one said magnetron to the or an other, form a barrier which tends to prevent the escape of electrons from within a plasma-containing working space within which the substrate is coated.

Such a method is particularly apt for achieving a high ion current density at in the region of the substrate being coated.

The use of a CFUBMSIP method, in which at least partial closure of the field by such a barrier tends to prevent the escape of electrons from the working space, promotes ionisation in that space, and this in turn acts to promote the intensity of the ion bombardment the substrate will receive during deposition of the coating. As a result, a high ion current density (icd) can be achieved. In preferred embodiments of the invention, such a barrier to electron escape takes the form of a notional tube surrounding the substrate. The ends of such a tubular barrier may be open or closed.

Such a CFUBMSIP method of deposition is the preferred method of deposition although other methods giving high icd can also be used.

When sputter ion plating, the article being coated is preferably held at a bias voltage of from floating voltage to 250V negative. These are inclusive values, and the bias voltage applied may be DC, pulsed DC or RF. Preferably such bias is between 50V and 150V negative, and the best results have been attained when such bias is between 70 and 100 volts negative.

A very simple and preferred way of forming a said coating is to rotate the substrate while it is being coated. This assists in achieving an even coating on the substrate, and also has advantages in the deposition of a plural layer coating.

A particularly convenient way of achieving the optimum proportions of carbon and metal in a multi-layer coating is to use three carbon-donating targets and one metal-donating target for forming the coating. The substrate may be rotated in a working space between such targets and this is a highly advantageous way of building up a coating from a succession of alternating metal-containing and carbon strata.

The rotational speed of the substrate and the rates of deposition of the carbon and metal are suitably so controlled as to yield a period of at least 3 nm in the coating strata. If the period is too small, there is a risk that the carbon and metal will react and combine to form a metal carbide. While metal carbide may be tolerated in any said metal-containing layer, the replacement of carbon-carbon bonds by metal carbide bonds in a said carbon layer would detract from the quite remarkable properties afforded by this invention. It may be noted that it is the carbon layers having graphitic carbon-carbon bonds which provide these tribological properties; while such carbon layers may contain small proportions of metal (and indeed this may be difficult to avoid when using some deposition techniques) the presence of such metal is purely incidental, and the excellent wear-resistance and low friction properties do not depend on the carbon layers containing any metal. The metal-containing layers have a strengthening or adhesion promoting or anti-spalling effect, and they thus allow the coating to be built up to a greater thickness if this is desired. The incorporation of metal layers can also enable the coating to withstand higher loads.

Preferably, said coating is deposited under an atmosphere containing a noble gas. The use of a noble gas avoids contamination of the deposited coating by compounds of a chemically active gas. It is generally found most convenient to use argon. The argon gas pressure in the sputter system is not critical and can be between about $7\times10^{-2}$ Pa ($5\times10^{-4}$ torr) and about 1 Pa ($1\times10^{-2}$ torr). Preferably, said coating is deposited under an argon-containing atmosphere at a pressure of from 0.07 Pa to 0.6 Pa.

While it is desirable to avoid contamination of the coating by compounds of a chemically active gas, the invention does not exclude the possibility of deliberately modifying the coating composition by introducing such a gas into the atmosphere in the sputtering chamber.

Thus for example, the coatings which are formed can be modified by the inclusion of a hydro-carbon gas in the sputtering atmosphere during deposition as is provided in some embodiments of this invention. A feature of such a method may be that a mixture of carbon and metal is sputtered to deposit as a metal-containing layer on the substrate (the article being coated) which layer also contains additional carbon produced by breakdown of any hydrocarbon gas present in the working atmosphere and which deposits directly on the electrically biased substrate. Deposition of a said carbon layer may be by a combination of sputtering from the carbon target and breakdown of the hydrocarbon gas in the plasma.

Also, the coatings as described above can be modified by the addition of nitrogen to the working atmosphere during deposition. This can result in coatings modified by reaction of the nitrogen with the metal to form metal nitrides or with the carbon to from carbon-nitrogen compounds.

According to a further aspect of the invention we provide magnetron sputter ion plating apparatus having at least one metal-donating target and at least one carbon-donating target.

Such magnetron sputter ion plating apparatus preferably comprises at least two magnetrons adapted to generate a magnetic field between them with field lines extending from one said magnetron to the or an other said magnetron, whereby said magnetrons, and field lines extending directly from one said magnetron to the or an other, form a barrier which tends to prevent the escape of electrons from within a plasma-containing working space within which a substrate may be coated.

Preferably the arrangement is such as to permit the achievement of an ion current density of at least 0.5 mA/cm$^2$.

The use of carbon and metal targets allows great flexibility in the choice of conditions under which the coating layers are deposited. For example such conditions may be varied to vary the composition of a said metal-containing underlayer as it is deposited, for example so that its composition varies from metal, adjacent the substrate surface, through metal carbide to (graphitic) carbon at the carbon layer.

The invention extends to a coating formed by a method as herein defined and to any article bearing such a coating, and also to:

An article bearing a carbon-containing coating, wherein said coating has a specific wear rate under wet conditions of less than $10^{-16}$ m$^3$/Nm, and preferably less than $10^{-17}$ m$^3$/Nm;

An article bearing a carbon-containing coating, wherein said coating has an adhesion critical load of at least 70 N;

An article bearing a carbon-containing coating, wherein said coating has a hardness of at least 1000 VHN;

An article bearing a carbon-containing coating, wherein said coating has a coefficient of friction (dry) of not more than 0.1;

Any such article wherein said coating is black and/or is electrically conducting.

A said carbon-containing layer should most preferably have a structure with one or more of the following properties:

an absence of crystallinity detectable by X-ray diffraction or by selected area diffraction in a transmission electron microscope;

a predominant carbon-carbon bonding within the layer of the sp2 form indicated by Raman spectroscopy;

predominantly graphitic (sp2) bonding with very small grain size;

The very high hardness which may be exhibited by the coatings indicates that there must be some cross bonding. The coating structure may contain some C60, and some sp3 bonding may be present.

We have made various references to the excellent wear resistance properties afforded by coatings formed in accordance with this invention. It will be appreciated that different methods of measuring wear resistance may give different results, and accordingly, references in this specification, including its claims, to wear resistance of a given coating are, unless otherwise specified, references to specific wear resistance measured by the following test

SPECIFIC WEAR RESISTANCE TEST

A test coating is formed under the same conditions as the given coating but on a substrate which consists of a flat high-speed steel disc. The wear resistance of the test coating is measured in the following way.

A tungsten carbide pin having a hemispherical head which is uncoated and has a radius of 2.5 mm is rubbed against the test coating on the flat high speed steel disc. The specific loading on the pin is between 20 and 100 N, and the disc is rotated to give a rubbing speed of 180 mm per minute. (We have found that provided the loading on the pin is between 20 and 100 N, the specific wear rate afforded by this test is substantially independent of the actual loading.) When wet conditions are specified, the rubbing is performed under water unless another liquid is specified.

A taper section (angle less than 5°) through the rubbed surface is examined using an optical microscope at a magnification of 500× to measure of the wear of the coating. This method easily enables the measurement of specific wear rates as low as $10^{-17}$ m$^3$/Nm.

It will be appreciated that other tests are possible, and indeed some other tests are referred to in this specification. It is the test of the immediately preceding paragraphs which is the one which governs the values given in the claims of this specification.

A coating formed in accordance with this invention is useful in providing a hard, low friction, wear resistant surface for use in conditions where components are highly loaded, whether unlubricated or lubricated by oil or an aqueous medium. Examples of components which could usefully be provided with a coating in accordance with this invention abound in the automobile industry. Gear wheels, cam shafts, valves, piston rings, cylinder liners may be mentioned.

Also, the invention is of particular value in the field of medical prostheses, such as such as artificial hip, knee, or shoulder joints and heart valves, and the invention extends to a coated article as herein defined which is constituted as a medical prosthesis or a part thereof.

A problem with medical prostheses is the rubbing together of any co-operating surfaces of their moving parts after they have been implanted in the patient. This causes friction and wear of the rubbing surfaces. It is clearly undesirable to have to perform a surgical operation to replace a prosthesis to remedy a problem caused by a worn surface. In addition to mechanical problems associated with wearing of the prosthesis, there can be biochemical problems associated with debris from the wearing of the surfaces of the prostheses. These two problems are well-known.

This invention enables the provision of a new, hard-wearing, low-friction, prosthesis. In particular embodiments, the invention provides a prosthesis having at least a part coated with a coating which has a specific wear rate of $10^{-16}$ m$^3$/Nm or lower. Preferably the specific wear rate is $10^{-17}$ m$^3$/Nm or lower, possibly $10^{-18}$ or $10^{-19}$ m$^3$/Nm or lower.

The coating is, of course, a low-friction solid lubricant coating.

The invention enables us to provide a prosthesis having a coating such that, when rubbed against a cobalt-chromium plate also coated with a like coating and rubbed with a load of 40 N and a rubbing speed of 3 mm/sec, and rubbed water, no wear could be quantitatively measured after 1000 metres of rubbing.

Again, wear measurement is by inspection of a taper section (angle less than 5°) through the rubbed surface using an optical microscope at a magnification of 500×.

The prosthesis suitably comprises a metal substrate bearing the coating.

The coating is desirably formed to coat any mutually rubbing surfaces of the prosthesis which will move relative to each other in use.

Preferably the prosthesis comprises a chromium or titanium member coated with the coating. More preferably, the prosthesis comprises a cobalt-chromium alloy member, a titanium alloy member or a stainless steel member coated with the coating. The titanium alloy is preferably TiAlV.

According to the most preferred embodiments of the invention, a new type of carbon coating with excellent tribological properties has been developed. The new carbon coating appears to have very little diamond bonding. The improvement in coating has been demonstrated in many friction and wear experiments.

The carbon coating is simply deposited by magnetron sputter ion plating from a carbon target. The use of a method and apparatus as described in our UK Patent No. 2 258 343 (and corresponding European Patent No 0 521 045 and U.S. Pat. No. 5,556,519) gives particularly good results.

In a typical practical embodiment, a four-target closed field unbalanced magnetron sputter ion plating system such as is illustrated in FIG. 5 of UK Patent No. 2 258 343 is used.

An embodiment of the invention will now be described by way of example only, and with reference to the accompanying diagrammatic drawing which shows a plan view of an embodiment of closed field unbalanced magnetron sputter ion plating system.

In the drawing, four magnetrons 1, 2, 3, and 4 each have an outer ring magnet 5 and a central core magnet 6. The magnetrons are arranged around a carrier 7 for a substrate which is to be coated. The substrate carrier 7 is arranged to rotate as indicated by arrow 8 about an axis. It is usually most convenient to arrange for the substrate carrier 7 to rotate about a substantially vertical axis. In the drawing, which illustrates a practical arrangement, the outer magnets 5 of the magnetrons 1 and 3 are of south polarity and their inner core magnets 6 are of north polarity (in their regions which face the substrate carrier 7). The outer magnets 5 of magnetrons 2 and 4 are of north polarity and their cores 6 of south polarity (again, in their regions facing the substrate carrier 7). Thus the magnetic field lines B of magnetrons 1, 2, 3, and 4 form a continuous barrier, trapping electrons which diffuse from the magnetron plasmas, and they at least in part define a working space 10 within which the substrate carrier 7 rotates during the coating process. That barrier may extend over the axial ends of the working space 10 (usually its top and bottom) or not, as desired.

The drawing also shows targets 11, 12, 13, 14 of source material associated with the respective magnetrons 1, 2, 3, and 4. These targets cover the faces of the magnetron poles facing the substrate carrier 7, and the magnetrons each have a soft iron backing plate 15 to complete their internal magnetic circuits.

As will be seen from the drawing, the magnetic field lines B surround the substrate carrier 7 and serve to form a tubular working space 10 within which electrons are trapped. Since the electrons cannot escape the system, except perhaps at its axial ends, they are available to enhance the ionisation associated with the substrate, creating a high ion density.

In use an inert gas such as argon is provided in the chamber of the system and electrons are accelerated in the chamber by a potential difference applied to the magnetron targets 11, 12, 13, 14 to ionize the gas, producing more electrons and argon ions. The argon ions present in the chamber bombard the targets of source material and produce a coating flux of source material. It is suitable for three of the targets to be of carbon while one is of a transition metal such as chromium or titanium. The argon ions also bombard the substrate. The magnetic field lines B serve to form a continuous barrier to the electrons diffusing from the magnetron discharges and ensure that these electrons are not lost to the system through its sides without performing their useful function of enhancing the glow discharge associated with the negatively electrically biased substrates, increasing the ion current to the substrate.

The magnetrons 1, 2, 3, 4 are provided approximately equiangularly spaced in a ring with the substrate carrier 7 at is centre. They are carried within a coating chamber (not shown) which may be of cylindrical shape having axial bearings for supporting the substrate carrier 7 at its top and base. A pumping port (not shown) is provided out of line with the four magnetrons, for example in its base.

The magnetic field B forms a continuous ring surrounding the substrate and traps electrons in the ring. Since an even number of magnetron pole assemblies is provided the flux ring can be complete. There is an advantage in providing an even number of magnetrons. Six or eight magnetron pole assemblies are also considered good configurations, but clearly more could be provided if desired, and a system with but two magnetrons could also be used. Adjacent magnetrons would have outer magnet assemblies of opposite polarity, as illustrated.

In a variant embodiment, one opposed pair of magnetrons 1, 3 is made stronger than the other pair, and the polarities of one magnetron of that pair are reversed. The arrangement is such that magnetic field lines connect the outer poles of those magnetrons to form the electron barrier, while the other magnetrons 2, 4 are outside that barrier. They thus play no part in confining electrons, and merely serve to donate additional coating material. Such an arrangement is shown in FIG. 8 of GB Patent No. 2 258 343.

In the arrangement shown in the drawing, the plating system is arranged with three carbon-donating targets and one chromium-donating target, and the substrates to be coated are held on a rotating carrier 7 mounted between the targets to promote uniformity of coating and so that a multi-layer coating results.

In order to obtain stress-free coatings we prefer to use a fairly low bias voltage on the substrate to be, and accordingly the substrate is maintained at a bias voltage of 70V negative. The sputtering chamber contains an argon atmosphere at a pressure of about 0.3 Pa ($2 \times 10^{-3}$ torr). Use of the four-target closed field unbalanced magnetron sputter ion plating system ensures an ion current density at the substrate which is in excess of 0.5 mA/cm$^2$. At low ion current densities, typically less than 0.5 mA/cm$^2$, the coating has been found to have inferior tribological properties.

The power applied to the carbon target of the magnetron source is not critical and is limited only in the fact that high powers cause cracking of the target.

A typical deposition sequence which produces coatings with quite exceptional tribological properties is as follows:
  i. Ion clean the items to be coated;
  ii. deposit 0.05 to 0.2 $\mu$m of metal;
  iii. co-deposit metal and carbon to produce an underlayer stratum of chromium carbide of between 0.1 and 0.3 $\mu$m thickness;
  iv. gradually reduce the power on the metal target while rotating the substrate to produce a multi-stratum coating layer consisting of successive carbon and metal-containing strata.

This final coating can be as thick as the particular application demands but is typically between 1 and 5 $\mu$m.

The carbon or carbon/metal multi-layer coatings deposited as described above have been found to have remarkable tribological properties.

Adhesion Critical Load>70 N.

The Vickers hardness of the coating formed under the conditions specified was about 2500 VHN, but this can be varied from 1000 to more than 3000 VHN depending on the exact deposition conditions.

Coefficient of friction less than 0.1.

The specific wear rate for unlubricated (dry) rubbing in normal (humid) atmosphere is surprisingly low at about $2 \times 10^{-17}$ m$^3$/Nm. Under lubricated (wet) rubbing, the wear rate is much lower and it was in fact so low that it was difficult to make an accurate measurement of the wear rate under oil or water lubrication. This implies that such wear rate may be below $10^{-18}$ m$^3$/Nm and possibly even below $10^{-19}$ m$^3$/Nm.

The coating has the ability to resist wear at very high loads: loads of up to 800 N/mm$^2$ can be sustained by carbon layers and up to 3000 N/mm$^2$ can be sustained by multi-layer coatings in accordance with the most preferred embodiments of this invention. (Load measured when the coating was deposited on a substrate of high speed steel.) The wear coefficient quoted above for unlubricated rubbing is obtained at specific loads over 1800 N/mm$^2$.

It may be noted here that coatings formed in accordance with this invention are not intended for use in a vacuum. We have conducted tests under high vacuum and in a dry nitrogen atmosphere, and we have found that the wear rate in high vacuum or dry atmospheres is higher. This is consistent with a carbon coating layer having a largely graphitic structure.

Little sp3 bonding, i.e. diamond bonding, has been detected by UV Raman spectroscopy, and Raman spectroscopy indicates that the bonding is largely sp2, i.e. graphitic bonding. This is consistent with the fact that the coating is electrically conducting and with the higher wear rate experienced under high vacuum conditions.

The hardness between 1000 and 3000 VHN is exceptional for graphitic carbon. The deposition conditions provided by the CFUBMSIP (or other high icd systems) must produce some form of cross bonding to cause the high hardness.

The combination of high hardness and low friction is presumably responsible for the exceptionally low wear rate which has been shown in many tests and which is found to be consistently much lower than other carbon based coatings such as metal-containing, diamond-like carbon coatings, and the load-bearing capacity of our new carbon coatings is also much higher.

The coating methods of the present invention are of particular value in the field of medical prostheses because the resulting coatings have remarkable tribological properties; they are stable in water-based fluids and have very, very, low wear rates when wetted by those fluids. Our tests have shown that the wear rate of the coating under unlubricated (dry) rubbing conditions is very low (specific wear rate about $10^{-17}$ m$^3$/Nm as mentioned above), but when rubbed under water, the wear rate is so low as to make quantitative measurement very difficult. These tests were performed at low rubbing speeds, where hydrodynamic effects were impossible, and the low wear rate is truly a property of the coating.

We have performed further tests to show that similar good results are obtained when rubbing components coated with the carbon-containing coating when they are immersed in a bovine serum (0.01% NaN3) which simulates the conditions found in a body implant such as an artificial hip joint. Those tests in bovine serum show that the coated implant showed remarkably little wear.

Tests have also shown that the coatings are biocompatible and no deleterious effects have been detected due to the coating. It is known that carbon fibre implants are biologically acceptable. Carbon, in certain forms, is known to be bioactive (encouraging cell growth on it).

Cobalt chromium alloy materials are known to be suitable, and indeed conventional, materials for making prostheses such as artificial hip joints. In one test, a cobalt chromium alloy hemispherically-ended pin of radius 2.5 mm was rubbed against an uncoated cobalt chromium alloy flat plate under bovine serum lubrication in a reciprocating wear test. The specific loading was 400 MPa and the rubbing speed was 180 mm per minute. The specific wear rate was found to be $10^{-14}$ m$^3$/Nm. This is a reference point for comparing the uncoated cobalt chromium alloy material with a material which is coated in accordance with this invention.

We then coated the cobalt chromium flat plate with a carbon coating in accordance with this invention. The coating was a carbon-chromium coating deposited by co-sputtering carbon and chromium as described. An underlayer layer of chromium was deposited before the multi-stratum carbon-chromium layer. The thickness of the carbon-chromium layer was 3 $\mu$m.

Using an uncoated chromium alloy hemispherically-ended pin of radium 2.5 mm and a coated cobalt chromium flat plate and, performing the rubbing under water, according to the test herein specified, the wear rate was extremely low and could not be measured accurately. The specific wear rate in this case was certainly much lower than $10^{-17}$ m$^3$/Nm (which was the approximate wear rate for an equivalent test performed in air in unlubricated conditions with ambient humidity for a coated substrate). Thus, in comparison with an uncoated interface between two relatively moving/rubbing surfaces the coating has reduced the wear rate by a factor of more than 1000.

When the coating was tested in a pin-on-disc machine using a 5 mm diameter hemispherically-ended tungsten carbide pin rubbing a coated cobalt chromium flat plate under water with a load of 40 Newtons and a rubbing speed of 3 mm per second, no wear could be quantitatively measured after 1000 metres of rubbing. Similar results were achieved performing the test in bovine serum.

Measurement was attempted by optical microscopy of a tapered section of the rubbed surface as described above.

The carbon coating of the implant/prosthesis is biocompatible and is suitable for use in a human body.

The coating is suitable for reducing the wear in a wide range of artificial joints, including hip joints, knee joints, shoulder joints, etc. It is also suitable for reducing wear in less highly-loaded body implants, such as artificial heart valves. The above list is representative, but not limiting.

Typical prostheses used as body implants have surfaces which rub together. The two surfaces are usually be metal surfaces undergoing relative movement.

The coating may be deposited on one of the prosthesis surfaces which rub together, or on both of the surfaces. Clearly, the latter will give greater advantages.

It is envisaged that we would have a coating on a prosthesis/implant with a thickness of up to 10 $\mu$m, preferably 1–5 $\mu$m. The thickness depends on the use and the target lifetime of the prosthesis, for example practical thickness of a coating for joints is likely to be 3–4 $\mu$m but for less loaded parts (such as heart valves) it is likely to be less. To achieve this sort of coating the technique used will be as described with adjustment of the deposition time to give the required thickness.

What is claimed is:

1. An article bearing a carbon-containing coating, wherein the coating comprises carbon-carbon bonding and wherein the predominant carbon-carbon bonding within the coating is of the graphitic sp$^2$ form, indicated by Raman spectroscopy.

2. An article bearing a carbon-containing coating, wherein said coating comprises a succession of carbon and metal-containing layers, wherein the carbon-containing layers comprise carbon-carbon bonding and wherein the predominant carbon-carbon bonding within each carbon layer is of the graphitic sp$^2$ form, indicated b Raman spectroscopy.

3. An article according to claim 1, wherein the coating has a specific wear rate under wet conditions of less than $10^{-17}$ m$^3$/Nm.

4. An article according to claim 1, wherein said coating has an adhesion critical load of at least 70N.

5. An article according to claim 1, wherein said coating has a Vickers hardness of at least 1000 VHN.

6. An article according to claim 1, wherein said coating has a coefficient of friction (dry) of not more than 0.1.

7. An article according to any of claims 1 to 6, wherein said coating has a thickness of between 1 and 5 $\mu$m.

8. An article according to claim 2, wherein the coating comprises a plurality of carbon and intermediate metal-containing layers having a spatial periodicity in the coating of at least 3 nm.

9. An article according to claim 2, wherein said coating further includes a metal-containing underlayer.

10. An article according to claim 9, wherein said metal-containing underlayer has a thickness in the range 50 nm to 200 nm.

11. An article according to any of claims 8 to 10, wherein such metal-containing layer contains a transition metal.

12. An article according to claim 11, in which the transition metal is titanium or chromium.

13. An article bearing a carbon-containing coating, wherein the carbon-containing coating absorbs light at visible frequencies, is electrically conductive, and comprises carbon-carbon bonding, wherein the predominant carbon-carbon bonding is of the graphitic sp$^2$ form, indicated by Raman spectroscopy.

14. An article according to claim 13, wherein the carbon-containing coating is black.

15. An article bearing a carbon-containing coating, wherein the carbon-containing coating is black, is electrically conductive, has a specific wear rate of less than $10^{-17}$ m$^3$/Nm, has an adhesion critical load of at least 70 N, has a Vickers hardness of at least 1000 VHN, has a coefficient of friction (dry) of not more than 0.1, has a thickness of between 1 and 5 µm, and comprises carbon-carbon bonding, wherein the predominant carbon-carbon bonding is of the graphitic sp$^2$ form, indicated by Raman spectroscopy.

16. An article bearing a carbon-containing coating, wherein more of the carbon-carbon bonding within the coating is of the graphitic sp$^2$ form than is in the diamond sp$^3$ form, as shown by Raman spectroscopy.

17. An article bearing a carbon-containing coating, wherein said coating comprises a succession of carbon and metal-containing layers and in which more of the carbon-carbon bonding within each carbon layer is of the graphitic sp$^2$ form than is in the diamond sp$^3$ form, as shown by Raman spectroscopy.

18. An article bearing a carbon-containing coating, wherein the carbon-containing coating absorbs light at visible frequencies, is electrically conductive, and comprises carbon-carbon bonds, wherein more of the carbon-carbon bonds are in the graphitic sp$^2$ form than are in the diamond sp$^3$ form, as shown by Raman spectroscopy.

19. An article bearing a carbon-containing coating, wherein the carbon-containing coating is black, is electrically conductive, has a specific wear rate of less than $10^{-17}$ m$^3$/Nm, has an adhesion critical load of at least 70 N, has a Vickers hardness of at least 1000 VHN, has a coefficient of friction (dry) of not more than 0.1, has a thickness of between 1 and 5 µm, and comprises carbon-carbon bonds, wherein more of the carbon-carbon bonds are in the graphitic sp$^2$ form than are in the diamond sp$^3$ form, as shown by Raman spectroscopy.

* * * * *